(12) United States Patent
Chuang et al.

(10) Patent No.: US 8,659,936 B2
(45) Date of Patent: Feb. 25, 2014

(54) LOW POWER STATIC RANDOM ACCESS MEMORY

(75) Inventors: Ching-Te Chuang, Taipei County (TW); Hao-I Yang, Taipei (TW); Mao-Chih Hsia, Kaohsiung (TW); Wei Hwang, Taipei (TW); Chia-Cheng Chen, Taichung County (TW); Wei-Chiang Shih, Taipei (TW)

(73) Assignees: Faraday Technology Corp., Science-Based Indusrial Park, Hsin-Chu (TW); National Chiao Tung University, Hsinchu (TW)

( * ) Notice: Subject to any disclaimer, the term of this patent is extended or adjusted under 35 U.S.C. 154(b) by 460 days.

(21) Appl. No.: 12/979,345

(22) Filed: Dec. 28, 2010

(65) Prior Publication Data

US 2012/0008449 A1 Jan. 12, 2012

Related U.S. Application Data

(60) Provisional application No. 61/361,528, filed on Jul. 6, 2010.

(51) Int. Cl.
*G11C 11/21* (2006.01)

(52) U.S. Cl.
USPC .......................................... 365/154; 365/226

(58) Field of Classification Search
USPC .......... 365/154, 189.16, 189.11, 226, 189.05, 365/189.15
See application file for complete search history.

(56) References Cited

U.S. PATENT DOCUMENTS

| | | | |
|---|---|---|---|
| 7,502,275 B2 * | 3/2009 | Nii et al. | 365/226 |
| 7,978,554 B2 * | 7/2011 | Kim et al. | 365/210.1 |
| 7,978,559 B2 * | 7/2011 | Kim et al. | 365/226 |
| 8,018,788 B2 * | 9/2011 | Jung et al. | 365/226 |
| 2006/0119393 A1 * | 6/2006 | Hua et al. | 326/121 |
| 2006/0291274 A1 * | 12/2006 | Uematsu | 365/154 |
| 2007/0236983 A1 * | 10/2007 | Wang et al. | 365/154 |
| 2007/0274124 A1 * | 11/2007 | Otsuka | 365/154 |
| 2009/0010053 A1 * | 1/2009 | Chiu et al. | 365/182 |
| 2009/0016138 A1 * | 1/2009 | Bhatia | 365/226 |
| 2009/0207675 A1 * | 8/2009 | Kengeri et al. | 365/189.14 |
| 2010/0309736 A1 * | 12/2010 | Russell et al. | 365/189.011 |

* cited by examiner

*Primary Examiner* — Douglas King
(74) *Attorney, Agent, or Firm* — Winston Hsu; Scott Margo

(57) ABSTRACT

A SRAM that keeps the memory cell array under a low voltage in the Standby mode and Write mode, and raises the memory cell array supply voltage to a high voltage in the Read mode. A SRAM comprising: at least one memory cell circuit, comprising a latch circuit with at least two inverters, and comprising two power receiving terminals for receiving power; and a power supplying circuit, for providing the power to the memory cell circuit, such that the voltages at the power receiving terminals of the latch circuit is below a predetermined voltage level when data is written to the latch circuit. In one embodiment, the memory cell circuit includes a plurality of data accessing terminals and the data accessing terminals are respectively controlled by at least two pass-transistor switch devices.

4 Claims, 14 Drawing Sheets

LOW POWER STATIC RANDOM ACCESS MEMORY

CROSS REFERENCE TO RELATED APPLICATIONS

This application claims the provisional application, which is U.S. Provisional Application No. 61/361,528, filed Jul. 6, 2010 and is included herein by reference.

BACKGROUND OF THE INVENTION

1. Field of the Invention

The present invention relates to a static random access memory (SRAM), and particularly relates to a SRAM that keeps the memory cell array under a low voltage in the Standby mode and Write mode, and raises the memory cell array supply voltage to a high voltage in the Read mode.

2. Description of the Prior Art

FIG. 1 is a circuit diagram illustrating a related prior art 6T SRAM static random access memory structure. As shown in FIG. 1, the 6T SRAM structure has a plurality of memory cell circuits, but only two memory cell circuits 101, 103 are symbolized for explaining. For a 6T SRAM cell during Read operation (FIG. 2), a Read disturb voltage is generated at the cell "0" storage node (NT in FIG. 2) when the WL is selected due to the voltage dividing effect between the access (pass-transistor) NMOS and pull-down NMOS. This Read disturb voltage degrades the Read Static Noise Margin (herein after RSNM) and may cause cell stability failures to limit the Read $V_{min}$ (Minimum operating voltage). If the Read disturb voltage is higher than the trip voltage of the opposite cell inverter, the cell may flip. During Read/Write operation, the half-selected cells on the selected WL perform dummy Read operation, thus experiencing "Half-Select disturb" similar to the Read disturb of selected cells as shown in FIG. 1.

In Standby mode, the supply voltage of the memory cell array can be lowered to reduce power consumption. In Read mode, the supply voltage of the memory cell array needs to be raised to higher voltage to maintain adequate RSNM and Read performance. In Write mode, to facilitate the writing of data into the memory cell, the supply voltage of the memory cell array should stay low. However, low cell array supply voltage aggravates the "Half-Select disturb", and the half-selected cells may flip. As a result, the cell array supply voltage for the entire active bank needs to be raised to higher voltage level, thus causing more power consumption.

SUMMARY OF THE INVENTION

Accordingly, one objective of the present invention is to provide a SRAM that can keep the cell array supply voltage at low level during Write operation to facilitate writing of data into the memory cell and to minimize power consumption in Write mode. Also, the cell array supply for the SRAM is raised only during Read operation to maintain adequate RSNM. The SRAM maintains low voltage in Write mode, which cannot be achieved using conventional 6T SRAM, to achieve Ultra-Low-Power (herein after ULP) mode of operation.

Another objective of the present invention is to provide a SRAM that can keep the cell array supply voltage at low level during Write operation to facilitate writing of data into the memory cell and to minimize power consumption in Write mode. Also, the cell array supply for the SRAM is raised only for the selected columns during Read operation to maintain adequate RSNM and to minimize power consumption in Read mode. The SRAM maintains low voltage for unselected columns in Read mode, and raises only the cell supply voltage for the selected columns in Read mode, thus achieving the Absolutely-Lowest-Power (herein after ALP) mode of operation.

One exemplary embodiment of the present invention discloses a SRAM comprising: at least one memory cell circuit, comprising a latch circuit with at least two inverters, and comprising two power receiving terminals for receiving power; and a power supplying circuit, for providing the power to the memory cell circuit, such that the supply voltages of the latch circuit is below a predetermined voltage level when data is written to the latch circuit. In one embodiment, the memory cell circuit includes a plurality of data accessing terminals and the data accessing terminals are respectively controlled by at least two pass-transistor switch devices.

In one exemplary embodiment, the power supplying circuit can further include a logic circuit, such that only the cell array supply for the selected columns will be raised to a high voltage in the Read mode.

Moreover, via aforementioned embodiments, only the cell array supply for one side of the cell (i.e. half-cell) is raised in Read mode, such that the cell supply switching power and noise can be reduced and the cell supply switching speed improved. Furthermore, in the ALP mode, only the cell array supply of the selected columns will be switched, thus the switching power and noise are further reduced, and the cell array supply switching speed further improved. Besides, only simple control circuit structure is needed. For example, each column only needs a power-switch device and power-keeping (keeper) devices. Also, to operate in the ALP mode, only simple decoding logic circuit is needed. Therefore, the device and area overhead is quite small.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

According to the concept disclosed in present application, two modes of the memory cell circuit are provided. One is called ULP mode and the other one is called ALP mode.

In the ULP mode, the supply voltage of the memory cell array in different operation modes can be shown as follows:

Standby or Sleep mode: Cell array supply voltage is reduced to save power.

Write mode: Cell array supply voltage stays low to facilitate Write.

Read mode: Cell array supply voltage is raised to maintain adequate RSNM and Read performance.

In the ALP mode, the supply voltage of the memory cell array in different operation modes can be shown as follows:

Standby or Sleep mode: Cell array supply voltage is reduced to save power.

Write mode: Cell array supply voltage stays low to facilitate Write.

Read mode: Cell array supply voltage is raised only for selected columns to maintain adequate RSNM and Read performance.

Figure 1:
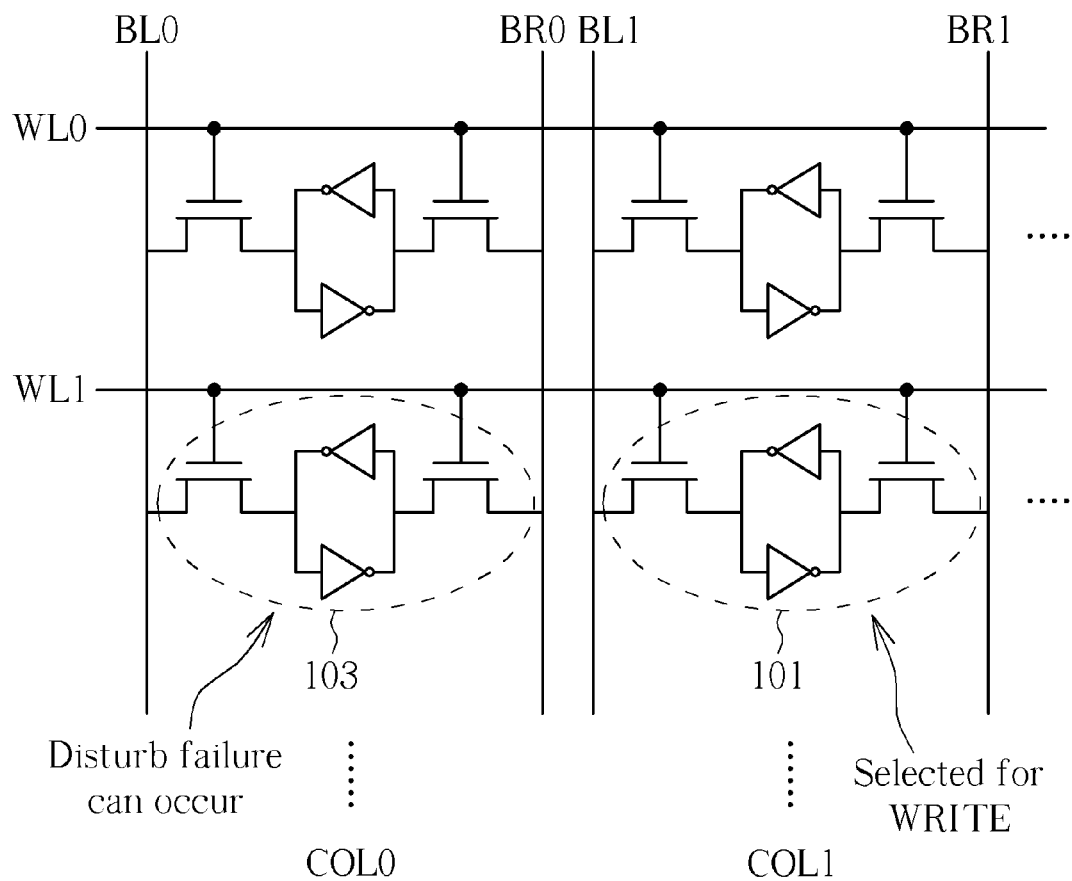
FIG. 1 is a circuit diagram illustrating a related art 6T SRAM structure.
Figure 2:
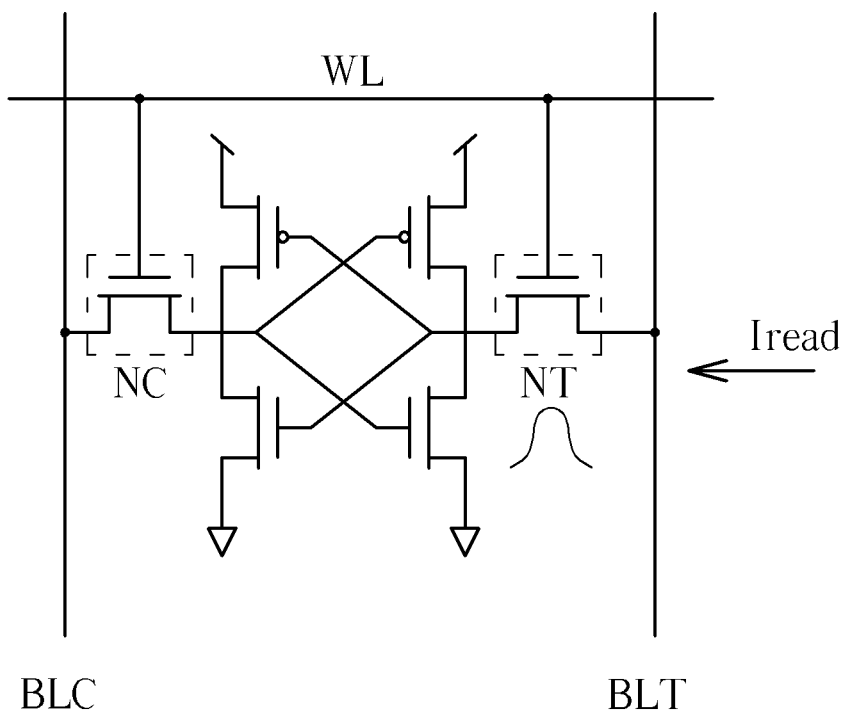
FIG. 2 is a schematic diagram illustrating the "Read disturb" issue in 6T SRAM.
Figure 3:
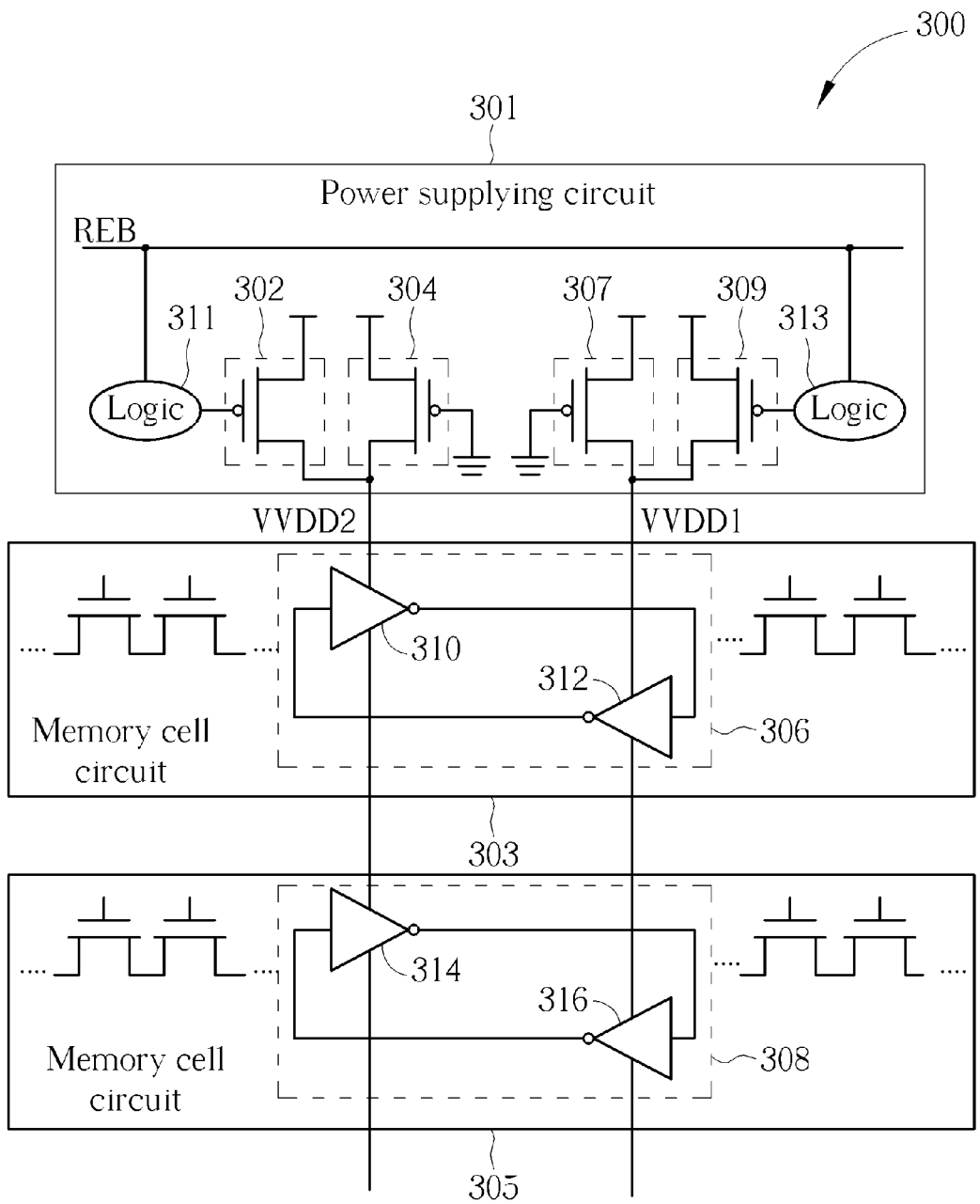
FIG. 3 is a block diagram illustrating a SRAM 300 according to one exemplary embodiment of the present application.

FIG. 3 is a block diagram illustrating a SRAM 300 according to one embodiment of the present application. As shown in FIG. 3, the SRAM 300 includes a power supplying circuit 301, and at least one memory cell circuit 303, 305 (the number of the memory cell circuits can be more than two, but only two of them are illustrated). The memory cell circuit 303, 305 respectively comprises latch circuits 306, 308 with at least two inverters, and comprises two power receiving terminals VVDD1, VVDD2 for receiving power from the power supplying circuit 301. In one embodiment, a cross-point double layer pass-gate structure can be applied to the memory cell circuit 303, where the data accessing terminals of the memory cell circuit 303 is respectively controlled by at least two pass-transistor switch devices. Detail embodiments of the memory cell circuit 303 will be described below.

The power supplying circuit 301 provides the power to the memory cell circuit 303 and 305, such that the cell array supply voltages (VVDD1 and VVDD2) of the latch circuit 306, 308 are below a predetermined voltage level VDD when the memory cell circuit 303 and 305 are in Standby mode. In Write mode, the cell array supply voltages (VVDD1 and VVDD2) stay low to facilitate writing of data into the selected cell. In Read mode (Read Enable Bar REB=0), the cell array supply voltages (VVDD1 and VVDD2) are raised (ex. coupled) to VDD to improve RSNM and Read performance.

The power supplying circuit 301 can include a plurality of transistors 302, 304, 307, 309. These transistors can be categorized as power switches (ex. 302, 309) or power keeper devices (ex. 304, 307). The power supplying circuit 301 can further includes logic circuits 311, 313, to control the power supplying circuits such that only selected columns of the memory cell array have raised cell array supply voltages.

Figure 4:
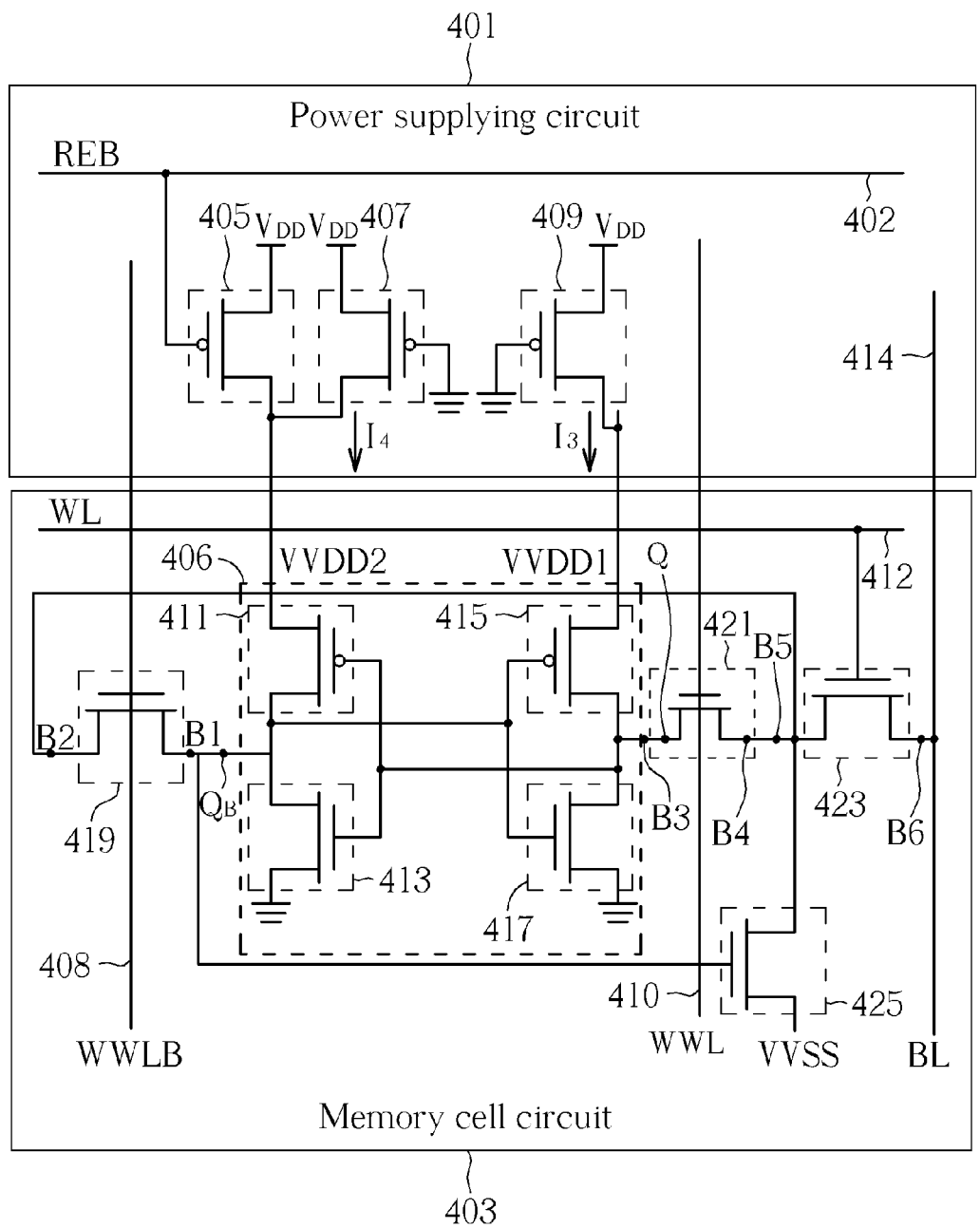
FIG. 4 is a circuit diagram illustrating detail structures for a SRAM according to one exemplary embodiment of the present application.

FIG. 4 is a circuit diagram illustrating detail structures for a SRAM according to one exemplary embodiment of the present application. As shown in FIG. 4, the power supplying circuit 401 comprises: a Read Enable Bar (REB) signal transmitting line 402, a power switch device 405, and two power keeper devices 407, 409. The Read Enable Bar signal transmitting line 402 transmits a Read Enable Bar signal REB. The power switch device 405 provides the power to one of the power receiving terminals VVDD1 and VVDD2, and turns on/off according to the Read Enable Bar signal REB. The power keeper device 407, 409 respectively have a terminal coupled to the predetermined voltage level VDD, and another terminal respectively coupled to the power receiving terminals VVDD1 or VVDD2. In one embodiment, the PMOS-FETs are utilized to implement the power switch device 405, and the power keeper devices 407, 409, but it does not mean to limit the scope of the present application. Other types of transistors can also be applied to the power switch device 405, and the power keeper devices 407, 409. For example, NMOS-FETs are utilized in the exemplary embodiment shown in FIG. 13.

The memory cell circuit 403 includes a latch circuit 406. The latch circuit 406 comprises two cross-coupled inverters (411/413 and 415/417). The memory cell circuit 403 further includes pass-transistor switches 419, 421, and 423. The pass-transistor switch 423 has its control terminal (i.e. gate) controlled by the row-based Word-Line (WL). The pass-transistor switch 419 and 421 have their control terminals (i.e. gates) controlled by the column-based Write Word-Line (WWLB) 408 and Write Word-Line (WWL) 410. The structure of the memory cell circuit 403 shown in FIG. 4 can also be named as a cross-point double-layer pass-gate structure. The latch circuit 406 has a access terminal QB and a access terminal Q, and has power receiving terminals VVDD1 and VVDD2 to receive the power from the power supplying circuit 401. The pass-transistor switch 419 has a bit transferring terminal B1 coupled to the access terminal QB, a control terminal coupled to a Write Word-Line (WWLB) 408, and a bit transferring terminal B2. The pass-transistor switch 421 has a bit transferring terminal B3 coupled to the access terminal Q, a control terminal coupled to a Write Word-Line (WWL) 410, and a bit transferring terminal B4 coupled to the bit transferring terminal B2. The pass-transistor switch 423 has a bit transferring terminal B5 coupled to the bit transferring terminal B4, a control terminal coupled to a Word Line (WL) 412, and a bit transferring terminal BE coupled to a Bit-Line (BL) 414. The switching circuit 425 has a control terminal coupled to the bit transferring terminal B1 of the pass-transistor switch 419, a terminal coupled to the bit transferring terminal B5 of the pass-transistor switch 423, and a terminal coupled to a reference voltage level VVSS.

Besides, the memory cell circuit 403 can further comprise a sensing amplifier, which is coupled to the Bit-Line (BL) 414, for determining a bit value appearing at the BL 414. However, the sensing amplifier is not illustrated in FIG. 4 of the present application.

In the exemplary embodiment shown in FIG. 4, the Read Enable Bar signal REB is 1 during Standby/Write modes, such that the power switch device 405 turns off. During Read mode, REB=0, the power switch device 405 turns on such that the voltage level at the power receiving terminal VVDDD2 can be raised to the predetermined voltage level VDD. This way, the RSNM and Read performance can be enhanced, especially when the logic value at QB is 1. Thus, the cell array supply stays low, except during Read operation in the aforementioned ULP mode.

The voltage values of VVDD1 and VVDD2 during different operation modes can be shown as Table 1:

TABLE 1

Voltage values of VVDD1 and VVDD2 in ULP mode.

|  | Standby | Read | Write |
| --- | --- | --- | --- |
| VVDD1 | <VDD | <VDD | <VDD |
| VVDD2 | <VDD | VDD | <VDD |

Also, the logic values of the Read Enable Bar signal REB, Write Word-Line (WWLB) 408, Write Word-Line (WWL) 410, the Word-Line (WL) 412, the Bit-Line (BL) 414, and the reference voltage level VVSS can be shown as in Table 2:

TABLE 2

Signal values in ULP mode.

|  | Standby | Read | Write "1" | Write "0" |
| --- | --- | --- | --- | --- |
| REB | 1 | 0 | 1 | 1 |
| 414 | 1 | X | 0 | 0 |
| 412 | 0 | 1 | 1 | 1 |
| 410 | 0 | 0 | 0 | 1 |
| 408 | 0 | 0 | 1 | 0 |
| VVSS | X | 0 | 1 | 0 |

Via aforementioned embodiment, adequate Hold Static Noise Margin for half-selected cells on the selected column can be maintained even if the cell array supply voltages are kept low in the Write mode. The power keeper devices 407, 409 provide enough power to the memory cell array Standby and Write modes.

Figure 5:
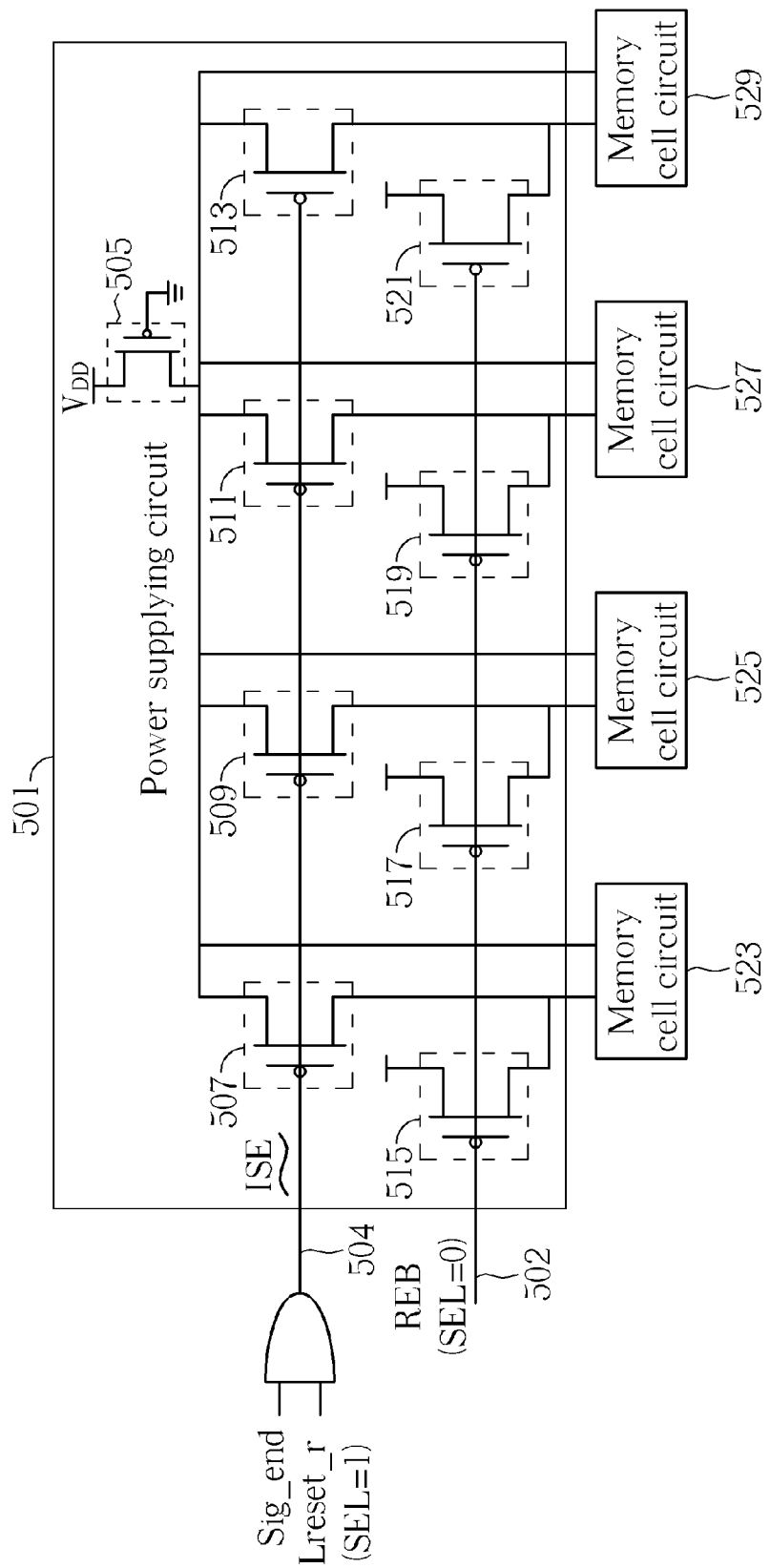
FIG. 5 is a circuit diagram illustrating detail structures for a SRAM where several columns share one keeper, according to another exemplary embodiment of the present application.

FIG. 5 is a circuit diagram illustrating detail structures for a SRAM according to another exemplary embodiment of the present application. In the exemplary embodiment shown in FIG. 4, each column of memory cell array utilizes at least one corresponding power keeper device. However, in the exemplary embodiment shown in FIG. 5, it allows several columns of memory cell array to share a power keeper device. As shown in FIG. 5, the power supplying circuit 501 includes: a Read Enable Bar (REB) signal transmitting line 502, a power keeper device 505, a plurality of isolation devices 507~513, and a plurality of power switch devices 515~521. Similar to the exemplary embodiment shown in FIG. 4, the Read Enable Bar signal transmitting line 502 transmits a Read Enable Bar signal REB. The power switch devices 515~521 provide the power to the power receiving terminals of a plurality of the memory cell circuits, and turn on or off according to the Read Enable Bar signal REB. The power keeper device 505 has a terminal coupled to the predetermined voltage level VDD, and a terminal respectively coupled to the power receiving terminals (only a group of them is illustrated in this exemplary embodiment) of the memory cell circuits 523~529. The power switch device 515~521 turn on when in the Read mode.

One difference between the exemplary embodiments shown in FIG. 4 and FIG. 5 is that the power keeper device 505 in FIG. 5 is shared by a plurality of memory cell circuits in several columns. By this way, the capacitances at the power receiving terminals (VVDD1 and VVDD2 in FIG. 4) increase. The increased capacitances reduce cell array supply variation in Standby mode (caused by leakage of cells on the same column), and reduce cell array supply voltage drop during Write (caused by Write current and leakage of cells on the same column.

Another difference between the exemplary embodiments shown in FIG. 4 and FIG. 5 is that the exemplary embodiment shown in FIG. 5 includes a plurality of isolation devices 507~513. The isolation device 507~513 respectively has a control terminal coupled to a Isolation Enable signal ISE, a terminal coupled to the power keeper device 505, and a terminal coupled to the memory cell circuit 523~529, wherein the isolation devices 507~513 are controlled by the Isolation Enable signal ISE to turn on or off, thus connecting or disconnecting the power keeper device 505 from one side (left side as shown in FIG. 5) of the power receiving terminals of the memory cell array. In the exemplary embodiment shown in FIG. 5, the Isolation Enable signal ISE is generated according two signals. One is a reset signal Lreset, which is 1 when asserted, and the other one is an external control signal Sig_end. Via the isolation devices 507~513, it can be determined whether one side or two sides of the virtual cell array supply nodes (VVDD1 and VVDD2) will be charged (raised) in Read mode. If the isolation devices 507~513 turn on, the voltages at the power receiving terminals VVDD1 or VVDD2 are charged (raised) together in Read mode. If the isolation devices 507~513 turnoff, only the voltage level at the power receiving terminal VVDD2 will be charged (raised) by the power switch devices 515~521 in Read mode, and VVDD1 will remain low in Read mode.

Figure 6:
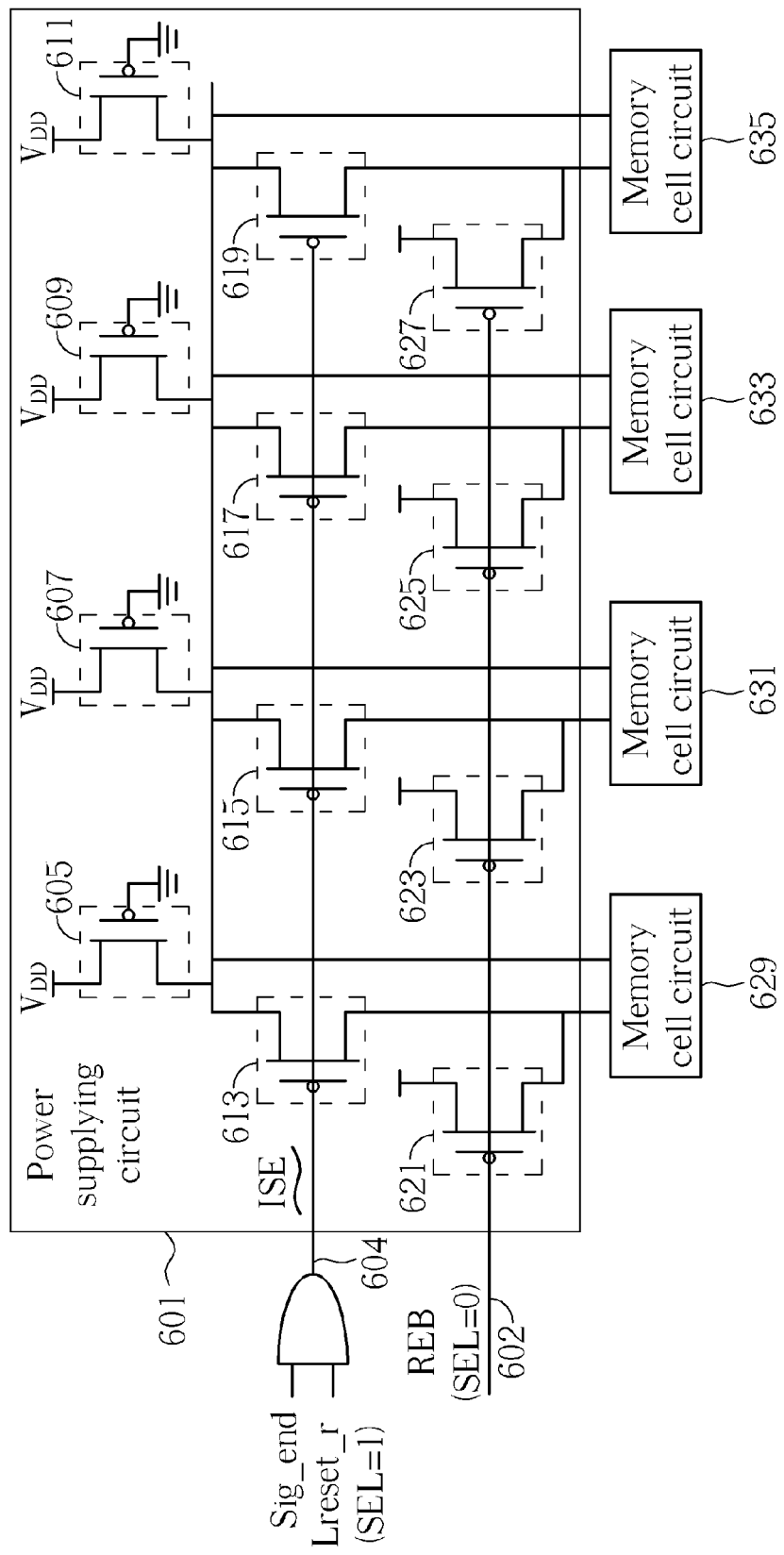
FIG. 6 is a circuit diagram illustrating detail structures for a SRAM utilizing programmable power keeper devices, according to another exemplary embodiment of the present application.

FIG. 6 is a circuit diagram illustrating detail structures for a SRAM according to another exemplary embodiment of the present application. Comparing the exemplary embodiments shown in FIG. 5 and FIG. 6, the exemplary embodiment in FIG. 6 also includes a Read Enable Bar (REB) signal transmitting line 602, a plurality of isolation devices 613~619, and a plurality of power switch devices 621~627. One difference between the exemplary embodiments shown in FIG. 5 and FIG. 6 is that the exemplary embodiments shown in FIG. 6 includes a plurality of power keeper devices 605~611. The power keeper devices 605~611 are programmable and can provide different amount of currents. By this way, the current provided by the power keeper devices 605~611 can be well adjusted and the voltage levels of the power receiving terminals VVDD1 and VVDD2 can be fine-tuned.

Figure 7:
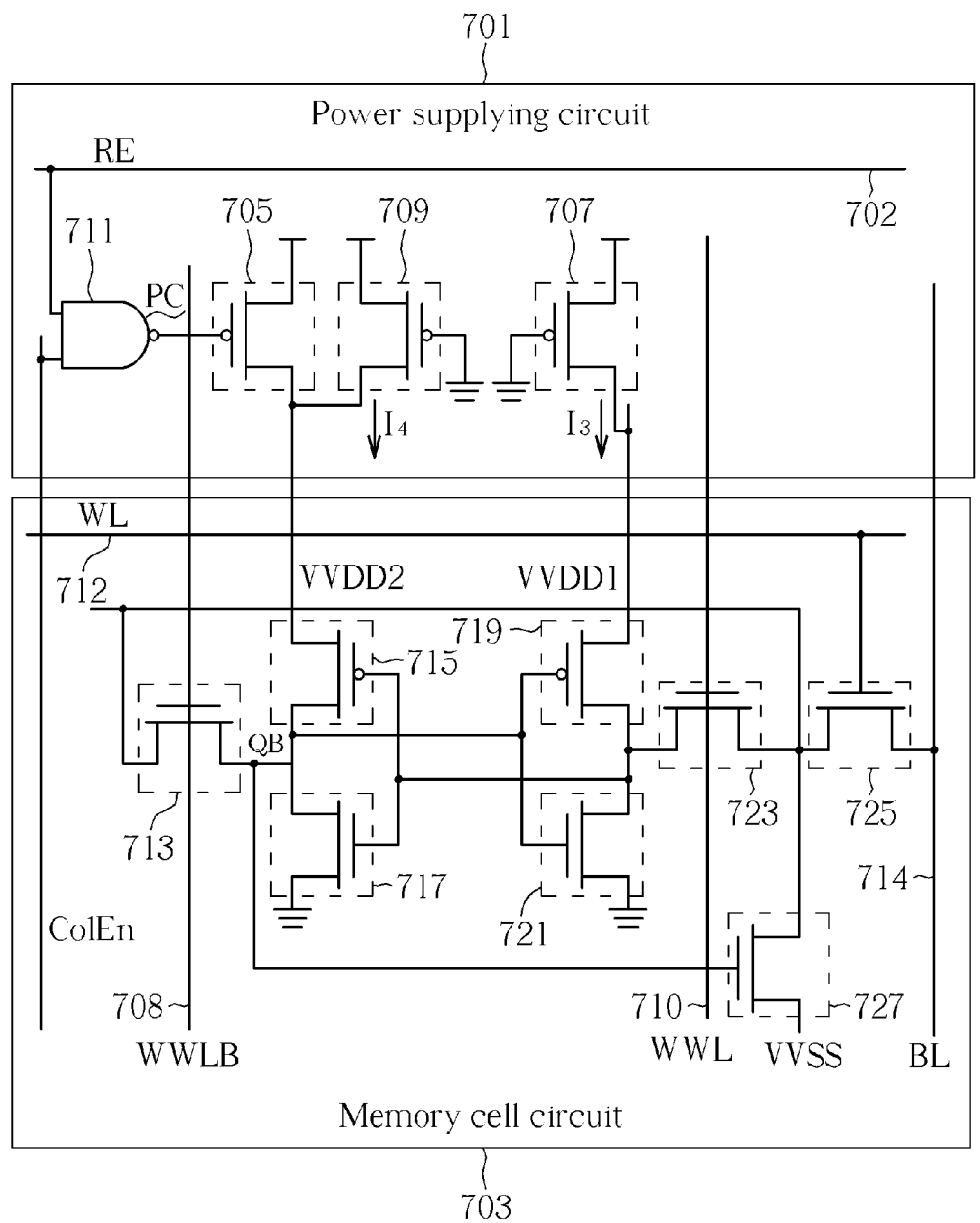
FIG. 7 is a circuit diagram illustrating detail structures for a SRAM having a logic circuit, such that only the cell array supply for the selected columns will be raised to a high voltage in the Read mode, according to another exemplary embodiment of the present application.

FIG. 7 is a circuit diagram illustrating detail structures for a SRAM having a logic circuit, according to another exemplary embodiment of the present application. Comparing the exemplary embodiments shown in FIG. 4 and FIG. 7, the power supplying circuit 701 shown in FIG. 7 includes a Read Enable (RE) signal transmitting line 702, a power switch device 705, and two power keeper devices 707, 709. Besides, the power supplying circuit 701 further includes a logic circuit 711 (in this embodiment, a NAND gate). The logic circuit 711 receives the Read Enable signal RE and a memory cell array Column-Select signal ColEn to output a power switch control signal PC, to control the turn on/off operation of the power switch device 705. By this way, the turning on/off operation of the power switch device 705 is controlled by not only the Read Enable signal RE but also the memory cell array Column-Select signal ColEn. For the selected columns, the memory cell Column-Select signal ColEn is 1. Thus, in Read mode, only the VVDD2's for the selected columns are raised.

The voltage values of VVDD1 and VVDD2 during different operation modes can be shown as Table 3:

TABLE 3

Voltage values of VVDD1 and VVDD2 in ALP mode.

|  | Standby | Read (Selected Column) | Read (Unselected Column) | Write |
|---|---|---|---|---|
| VVDD1 | <VDD | <VDD | <VDD | <VDD |
| VVDD2 | <VDD | VDD | <VDD | <VDD |

Referring to the concept in Table 3, only the virtual cell array supply voltages VVDD2 of the selected columns are pulled up to VDD in Read mode, and the virtual cell array supply voltages VVD1 of the selected columns are still lower than VDD. Accordingly, the exemplary embodiment shown in FIG. 7 can operate in the aforementioned ALP mode.

The logic values of the Read Enable signal RE, Write Word-Line (WWLB) 708, Writing Word-Line (WWL) 710, the Word-Line (WL) 712, the Bit-Line 714 (BL), and the reference voltage level VVSS can be shown as in Table 4.

TABLE 4

Signal values in ALP mode.

|  | Standby | Read | Write "1" | Write "0" |
|---|---|---|---|---|
| RE | 0 | 1 | 0 | 0 |
| 714 | 1 | X | 0 | 0 |
| 712 | 0 | 1 | 1 | 1 |
| 710 | 0 | 0 | 0 | 1 |
| 708 | 0 | 0 | 1 | 0 |
| VVSS | X | 0 | 1 | 0 |

Figure 8:
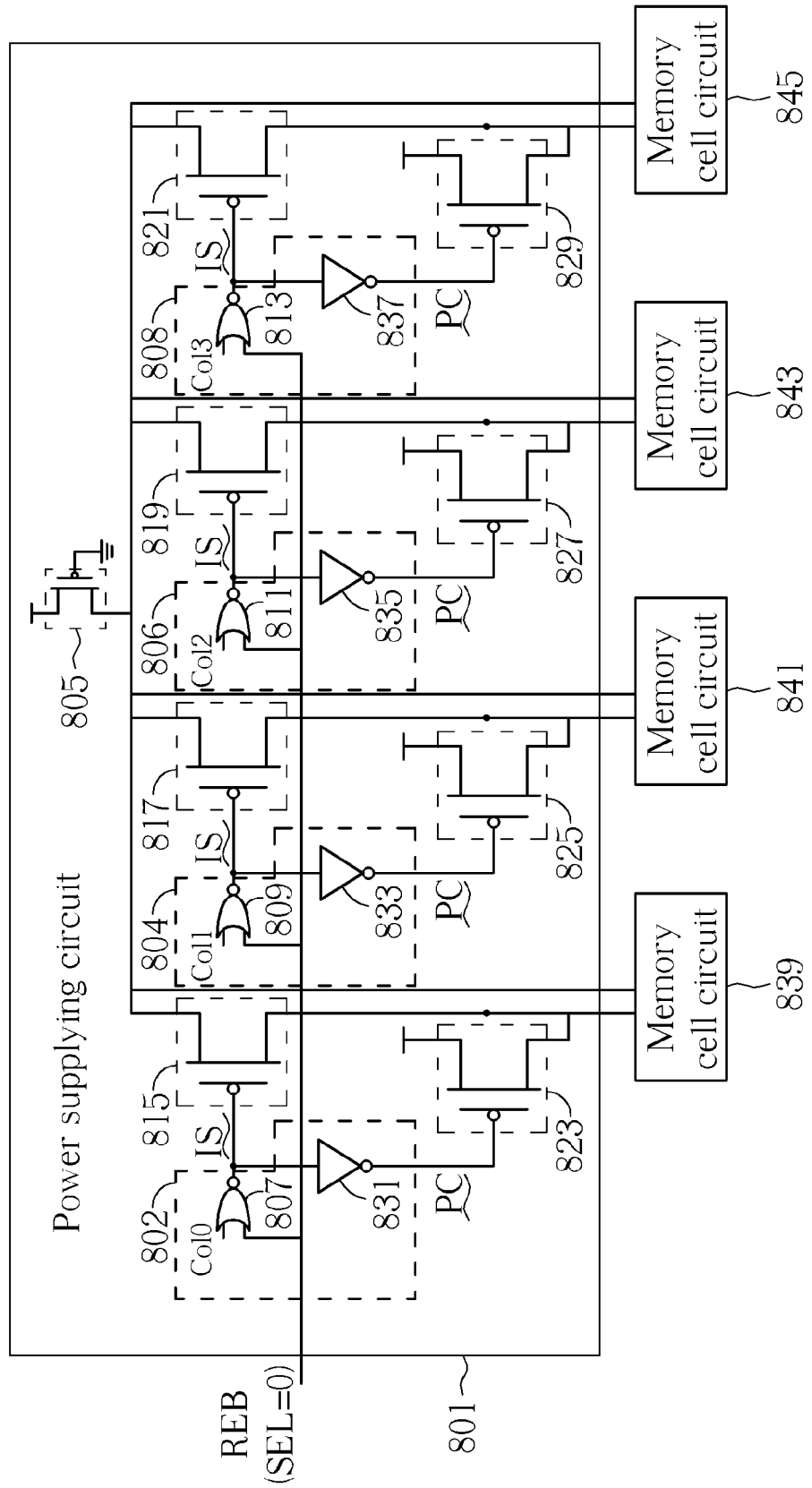
FIG. 8 is a circuit diagram illustrating detail structures for a SRAM where the power keeper is shared by several columns to increase the cell array virtual supply node capacitance, so as to reduce cell array supply variation in Standby mode (caused by leakage of cells on the same column), and to reduce cell array supply voltage drop during Write (caused by Write current and leakage of cells on the same column). In Read mode, only one side of the cell array supply for the selected column is raised, according to another exemplary embodiment of the present application.

FIG. 8 is a circuit diagram illustrating detail structures for a SRAM where several columns shares one keeper in ALP mode, according to another exemplary embodiment of the present application. Similar to the exemplary embodiment shown in FIG. 5, the power supplying circuit 801 in FIG. 8 includes a power keeper device 805, a plurality of isolation devices 815~821 and a plurality of power switch devices 823~829. The power supplying circuit 801 further comprises a plurality of logic circuits 802~808. In this exemplary embodiment, each of the logic circuits 802~808 has a NOR gate (807~813) and an inverter (831~837). The logic circuits 802~808 receive the Read Enable Bar signal REB and a Column Select signal (Col0~Col3, Select=0) to output a power switch control signal PC to control power switch devices 823~829, and a Isolation Control signal IS to control isolation devices 815~821. Similar to the isolation devices 507~513 in FIG. 5, it can be determined whether only one side of the power receiving terminal (VVDD2) of the selected column or two sides of the power receiving terminals (VVDD1 and VVDD2) of all columns will be charged (raised) in Read mode, via control of the isolation devices 815~821.

Figure 9:
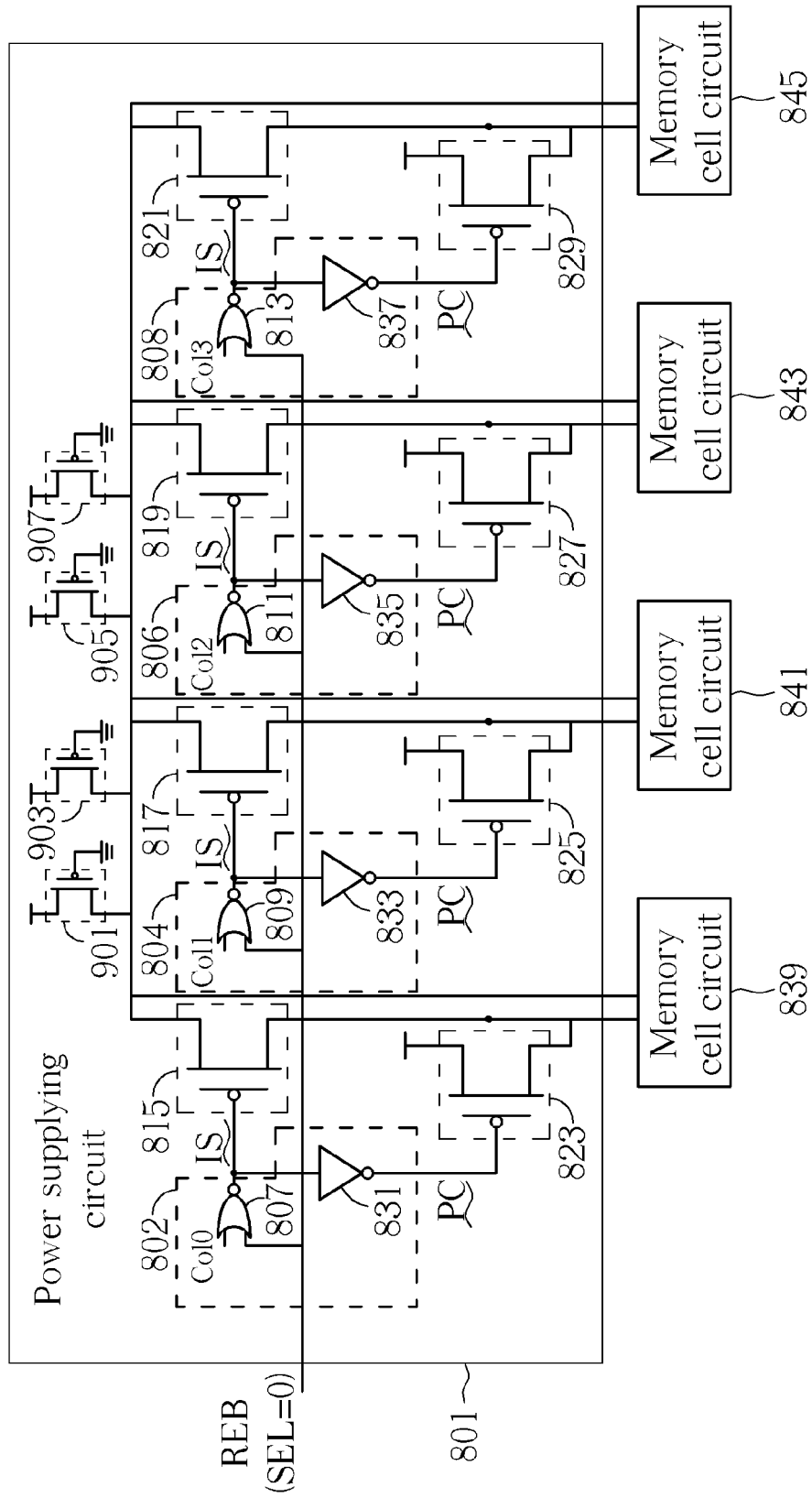
FIG. 9 is a circuit diagram illustrating detail structures for a SRAM utilizing programmable power keeper devices, where the programmable power keeper is shared by several columns, and only one side of the cell array supply for the selected column is raised in Read mode, according to another exemplary embodiment of the present application.

FIG. 9 is a circuit diagram illustrating detail structures for a SRAM in ALP mode utilizing programmable power keeper devices, according to another exemplary embodiment of the present application. In the exemplary embodiment in FIG. 9, programmable power keeper devices 901~907 replace the single power keeper device 805. As described in the exemplary embodiment of FIG. 6, the power keeper devices 901~907 are programmable power keeper devices and can provide different amounts of currents.

Figure 10:
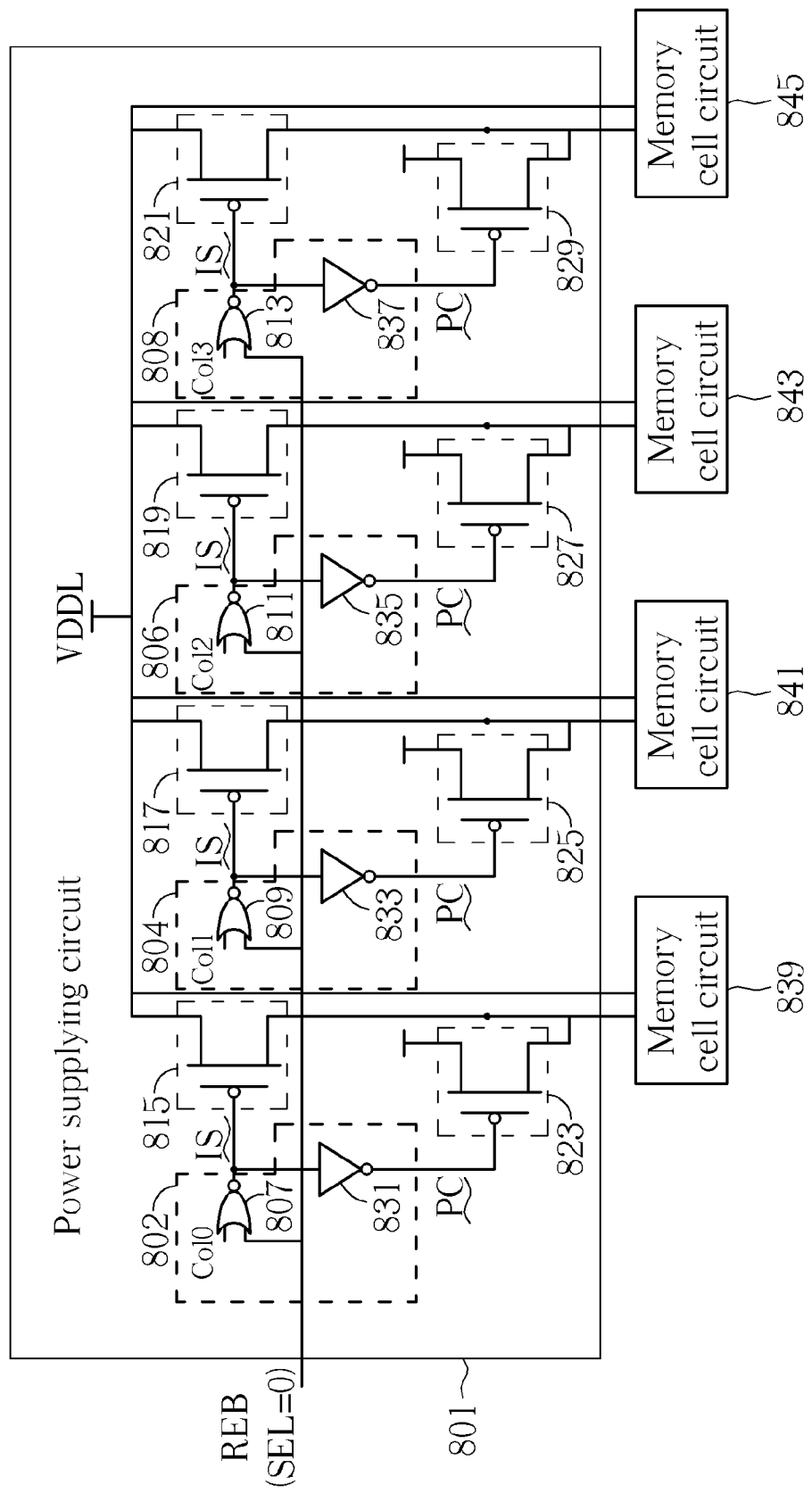
FIG. 10 is a circuit diagram illustrating detail structures for a SRAM utilizing dual power supply, where VDDL is a "lower-than-VDD" voltage supply, according to another exemplary embodiment of the present application.

FIG. 10 is a circuit diagram illustrating detail structures for a SRAM in ALP mode utilizing dual power supply, according to another exemplary embodiment of the present application. All devices in FIG. 10 are almost the same as that in FIG. 8 except the power keeper device 805 in FIG. 8 is replaced by a predetermined power supply source VDDL, which is lower than the predetermined voltage level VDD. According to the description of FIG. 8, the voltage levels of the power receiving terminals VVDD1 and VVDD2 for FIG. 10 can be shown as Table 5.

TABLE 5

Voltage values of VVDD1 and VVDD2 in ALP mode with dual supply.

|  | Standby | Read (Selected Column) | Read (Unselected Column) | Write |
|---|---|---|---|---|
| VVDD1 | VDDL | VDDL | VDDL | VDDL |
| VVDD2 | VDDL | VDD | VDDL | VDDL |

Figure 11:
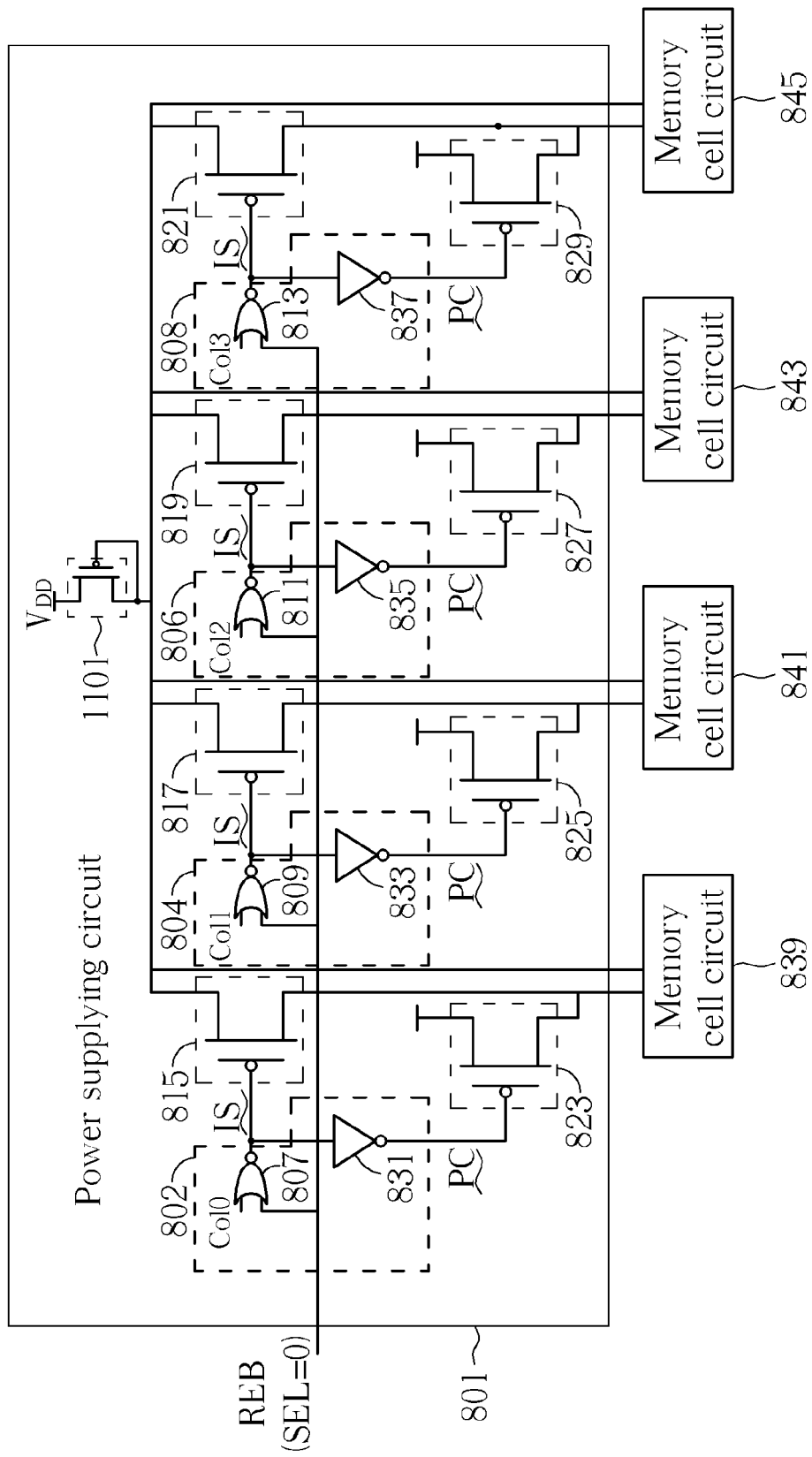
FIG. 11 is a circuit diagram illustrating detail structures for a SRAM utilizing a diode voltage drop to provide a "lower-than-VDD" voltage supply, according to another exemplary embodiment of the present application.

FIG. 11 is a circuit diagram illustrating detail structures for a SRAM in ALP mode utilizing a voltage decreasing device, according to another exemplary embodiment of the present application. In the exemplary embodiment shown in FIG. 11, the predetermined power supply source VDDL includes a voltage decreasing device 1101 coupled to the predetermined voltage level VDD. A PMOSFET having a gate terminal connected to a drain terminal (i.e. a diode-connected PMOSFET) thereof is applied to FIG. 11, but it should be noted that other voltage decreasing devices can also be applied to the present application.

Figure 12:
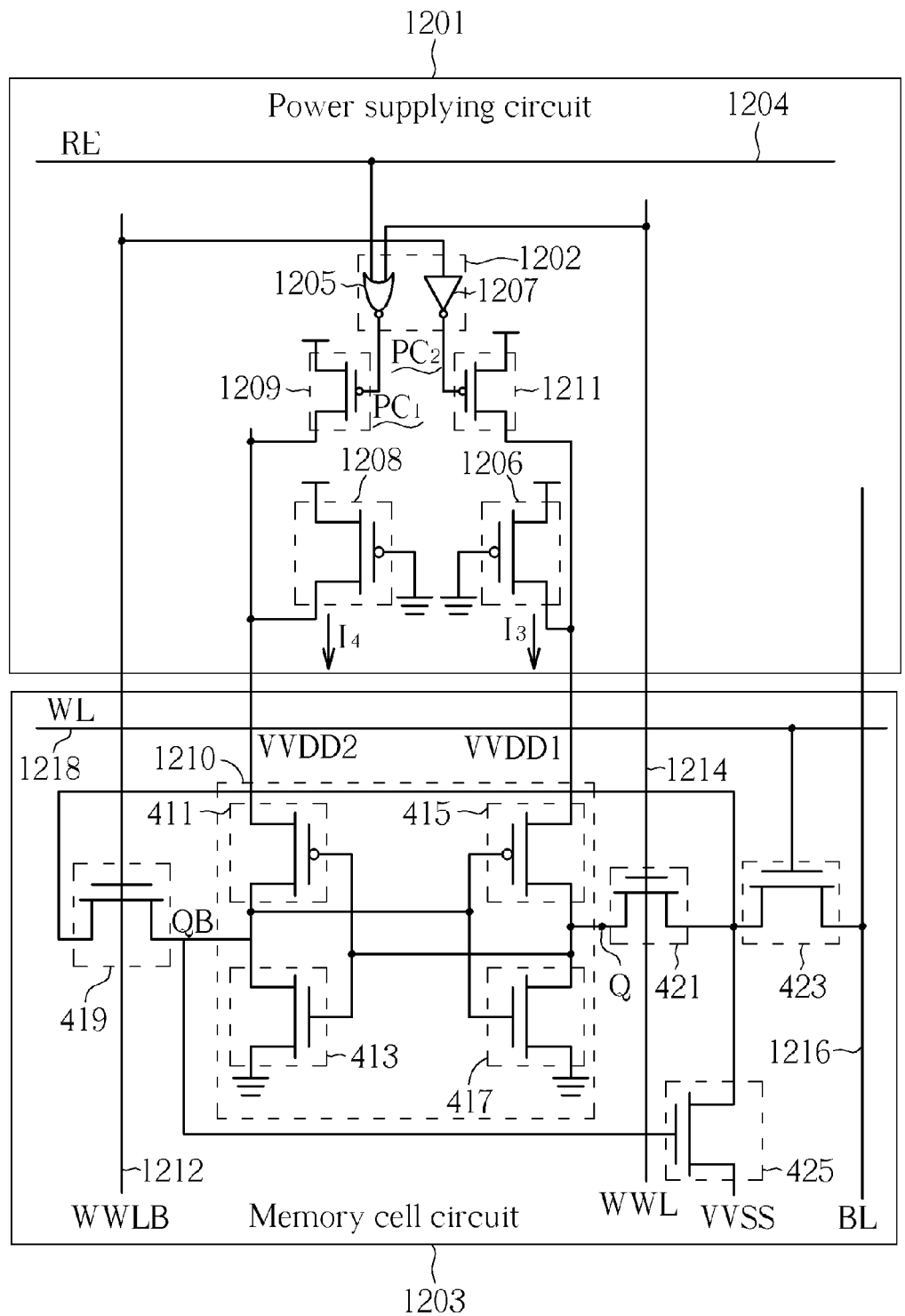
FIG. 12 is a circuit diagram illustrating detail structures for a SRAM having a logic circuit facilitating Writing operation, such that one side of the cell (i.e. half-cell) has its virtual cell supply voltage raised (depending on the data to be written) to strengthen the half-latch and speed up the feedback process, according to another exemplary embodiment of the present application.

FIG. 12 is a circuit diagram illustrating detail structures for a SRAM having a logic circuit facilitating Writing operation, according to another exemplary embodiment of the present application. As shown in FIG. 12, the power supplying circuit 1201 includes a Read Enable (RE) signal transmitting line 1204, two power switch devices 1209 and 1211, the power keeper devices 1206, 1208. The Read Enable signal transmitting line 1204 transmits a Read Enable signal RE. The logic circuit 1202, which includes a NOR gate 1205 and an inverter 1207, receives the Read Enable signal RE and data to be written to the latch circuit 1210 (i.e. the data on the Write Word-Lines 1212 (WWLB) and 1214 (WWL) to generate power control signal PC1 and PC2 for the power switch device 1209 and 1211, respectively. The power switch device 1209, 1211 provide the power to the power receiving terminals VVDD2 and VVDD1 according to the power control signal PC1 and PC2. The power keeper device 1206 and 1208 have a terminal coupled to the predetermined voltage level VDD, and a terminal respectively coupled to the power receiving terminals VVDD1 and VVDD2. The power switch device 1209 turns on during Read operation, when the data of the data accessing terminal QB is read, similar to the ULP mode in FIG. 4. In addition, during Write operation, the voltage level of the power receiving terminals VVDD1 and VVDD2 are adaptively raised by the power switch device 1209 and 1211 according to the data to be written to the latch circuit 1210.

During the Standby mode, logic values of the Write Word-lines 1212 (WWLB) and 1214 (WWL) are 0, and the Read Enable (RE) signal is 0. Thus the power switch devices 1209 and 1211 turn off. During the Read mode, logic values of the Write Word-lines 1212 (WWLB) and 1214 (WWL) are 0, and the Read Enable (RE) signal is 1. Thus the power device 1209 turns onto raise VVDD2 to enhance Read performance. During the Write mode, the power switch device 1211 turns on to raise VVDD1 while writing data 1 to the data accessing terminal Q, thus strengthening the right half-latch (i.e. inverter comprising PMOS 415 and NMOS 417) to speed up the feedback and improve Write Margin (WM) and Write performance. Similarly, the power switch device 1209 turns on to raise VVDD2 while writing data 0 to the data accessing terminal Q, thus strengthening the left half-latch (i.e. inverter comprising PMOS 411 and NMOS 413) to speed up the feedback and improve Write Margin (WM) and Write performance.

For more detail, the voltage levels of the power accessing terminals VVDD1 and VVDD2 can be shown as Table 6.

TABLE 6

Voltage values of VVDD1 and VVDD2 in ULP mode with adaptively strengthened half-latch during Write operation.

|  | Standby | Read | Write "1" | Write "0" |
| --- | --- | --- | --- | --- |
| VVDD1 | <VDD | <VDD | VDD | <VDD |
| VVDD2 | <VDD | VDD | <VDD | VDD |

Thus, the circuit disclosed in FIG. 12 can operate in the aforementioned ULP mode with additional capability of adaptively raising VVDD1 or VVDD2 to strengthen the right- or left-half latch during Write operation to improve Write Margin and Write performance.

The logic values of the Read Enable signal RE, the Write Word Lines 1212 (WWLB), 1214 (WWL), the Bit-Line (BL) 1216, the Word-Line (WL) 1218 and the reference voltage VVSS are as shown in Table 7.

TABLE 7

Signal values of ULP mode with adaptively strengthened half-latch during Write operation.

|  | Standby | Read | Write "1" | Write "0" |
| --- | --- | --- | --- | --- |
| RE | 0 | 1 | 0 | 0 |
| 1216 | 1 | X | 0 | 0 |
| 1218 | 0 | 1 | 1 | 1 |
| 1212 | 0 | 0 | 1 | 0 |
| 1214 | 0 | 0 | 0 | 1 |
| VVSS | X | 0 | 1 | 0 |

Figure 13:
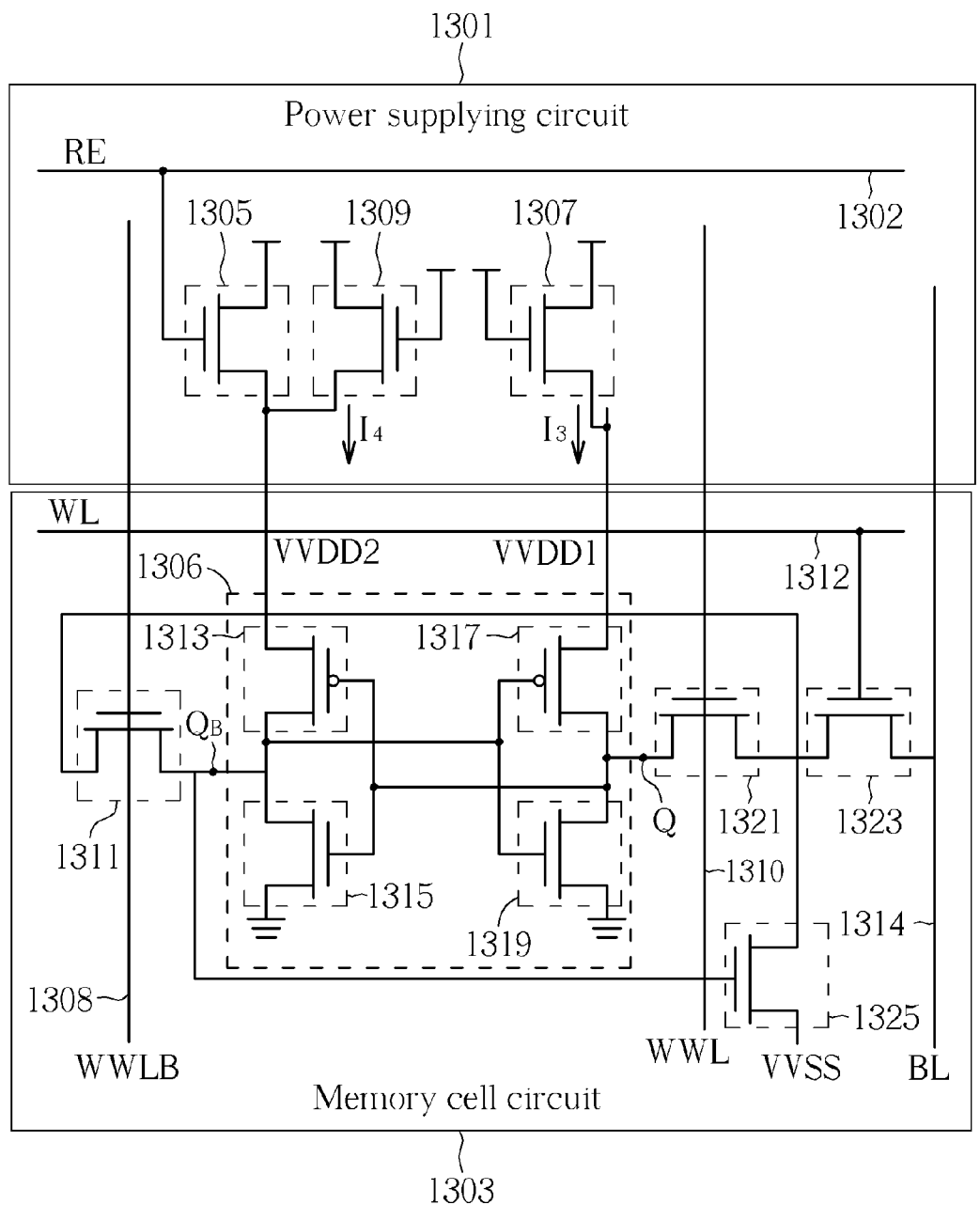
FIGS. 13 and 14 are an extension embodiments of the exemplary embodiment shown in FIG. 4.

FIG. 13 is an extension embodiment of the exemplary embodiment shown in FIG. 4. Similar to the exemplary embodiment shown in FIG. 4, the power supplying circuit 1301 comprises a Read Enable (RE) signal transmitting line 1302, a power switch device 1305, and two power keeper devices 1307 and 1309. Also, the memory cell circuit 1303 includes a latch circuit 1306, pass-transistor switches 1311, 1321, 1323 and switching circuit 1325. The difference between the exemplary embodiments shown in FIG. 4 and FIG. 13 is that the exemplary embodiment in FIG. 13 utilizes NMOSFETs as power switch device 1305 and two power keeper devices 1307, 1309, instead of PMOSFETs.

The voltage values at the power receiving terminals VVDD1, VVDD2 of the exemplary embodiment shown in FIG. 13 is the same as that shown in Table 1. Besides, the logic values of the Read Enable signal RE, Write Word-Line (WWLB) 1308, Write Word-Line (WWL) 1310, the Word Line (WL) 1312, the Bit-Line (BL) 1314, and the reference voltage level VVSS can be shown as in Table 8.

TABLE 8

Signal values of ULP mode with NMOSFET power switch and power keeper devices.

|  | Standby | Read | Write "1" | Write "0" |
| --- | --- | --- | --- | --- |
| RE | 0 | 1 | 0 | 0 |
| 1314 | 1 | X | 0 | 0 |
| 1312 | 0 | 1 | 1 | 1 |
| 1310 | 0 | 0 | 0 | 1 |
| 1308 | 0 | 0 | 1 | 0 |
| VVSS | X | 0 | 1 | 0 |

Figure 14:
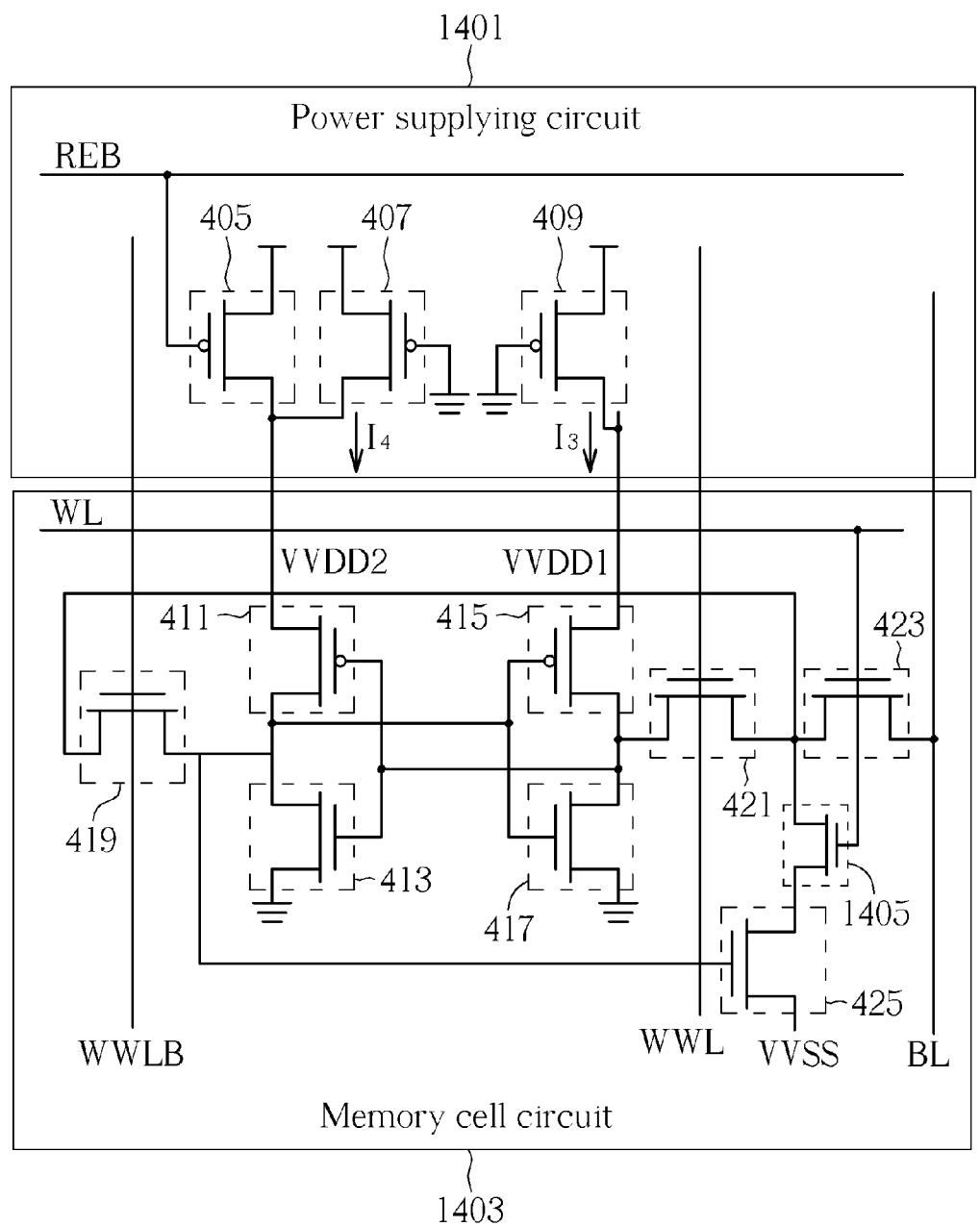

FIG. 14 is also an extension embodiments of the exemplary embodiment shown in FIG. 4. Comparing the exemplary embodiments shown in FIGS. 4 and 14, the memory cell circuit 1403 further includes a power switch device 1405. Accordingly, the memory cell circuit 1403 in the exemplary embodiment shown in FIG. 14 utilizes a 9T structure. The voltage levels at the power receiving terminals VVDD1 and VVDD2 and the logic values for the Read Enable Bar (REB) signal, the Write Word-Lines WWLB and WWL, the Word-Line (WL), the Bit-Line (BL), and the reference voltage level VVSS are the same as that of FIG. 4, thus it is omitted here for brevity.

Via aforementioned embodiments, in ULP mode, only one side of the virtual cell array supply node is switched during Read operation. Thus, the cell array supply switching noise is reduced and the cell array supply switching speed improved. Furthermore, in the ALP mode, only the cell array supply of the selected column is switched, thus the power consumption and noise can be further reduced, and the cell array supply switching speed further improved. Besides, only simple circuit structure is needed. For example, each column only needs a power switch device and power keeper devices. Also, for the circuit to operate in the ALP mode, only simple decoding logic circuit is needed.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A SRAM, comprising:
   at least one memory cell circuit, comprising a latch circuit with at least two inverters, and comprising two power receiving terminals for receiving power; and
   a power supplying circuit, for providing the power to the memory cell circuit, such that supply voltages at the power receiving terminals of the latch circuit are below a first predetermined voltage level when data is written to the latch circuit;

wherein the power supplying circuit comprises:
- a Read Enable Bar signal transmitting line, for transmitting a Read Enable Bar signal;
- a plurality of power switch devices, for providing the power to the power receiving terminals of only one of the memory cell circuits, and turning on or off according to the Read Enable Bar signal;
- at least one power keeper device, having a first terminal coupled to the first predetermined voltage level, and a second terminal respectively coupled to the power receiving terminals;
- wherein the power switch device turns on when the data stored in the inverter coupled to the power receiving terminal coupled to the power switch device is read;

wherein the SRAM further comprises a plurality of isolation devices, having a control terminal coupled to a Isolation Enable signal, a first terminal coupled to the power keeper device, and a second terminal coupled to the memo cell circuit, wherein the isolation devices are controlled by the Isolation Enable signal to turn on or off.

2. The SRAM of claim 1, wherein the power supplying circuit further comprises: a plurality of logic circuits, receiving the Read Enable Bar signal and a memory cell Column Select signal to output a power switch control signal, wherein the power switch device turns on or off according to the power switch control signal.

3. The SRAM of claim 1, wherein the memory cell circuit comprises:
- a latch circuit, having a first access terminal and a second access terminal, and having power receiving terminals to receive the power from the Write Assist circuit;
- a first pass-transistor switch circuit, having a first bit transferring terminal coupled to the first access terminal, a first control terminal coupled to a first Write Word-Line, and a second bit transferring terminal;
- a second pass-transistor switch circuit, having a third bit transferring terminal coupled to the second access terminal, a second control terminal coupled to a second Write Word-Line, and a fourth bit transferring terminal coupled to the second bit transferring terminal;
- a third pass-transistor switch circuit, having a fifth bit transferring terminal coupled to the fourth bit transferring terminal, a third control terminal coupled to a Word-Line, and a sixth bit transferring terminal coupled to a Bit-Line;
- a sensing amplifier, coupled to the Bit-Line, for determining a bit value appearing at the Bit-Line; and
- a fourth switching circuit, having a control terminal coupled to the first bit transferring terminal of the first pass-transistor switch circuit, a first terminal coupled to the fifth bit transferring terminal of the third pass-transistor switch circuit, and a second terminal coupled to a reference voltage level.

4. The SRAM of claim 3, wherein the memory cell circuit comprises:
- a fifth switching circuit, having a first terminal coupled to the fifth bit transferring terminal of the third pass-transistor switch circuit, a second terminal coupled to the first terminal of the fourth switching circuit, and a control terminal coupled to the Word-Line.

* * * * *